US008837197B2

(12) United States Patent
Oh et al.

(10) Patent No.: US 8,837,197 B2

(45) Date of Patent: Sep. 16, 2014

(54) CIRCUIT FOR GENERATING WRITE SIGNAL, VARIABLE RESISTANCE MEMORY DEVICE, AND METHOD FOR PROGRAMMING VARIABLE RESISTANCE MEMORY

(75) Inventors: Young-Hoon Oh, Hwaseong-Si (KR); Young-Don Choi, Seoul (KR); Ick-Hyun Song, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 345 days.

(21) Appl. No.: 13/369,361

(22) Filed: Feb. 9, 2012

(65) Prior Publication Data

US 2013/0051120 A1 Feb. 28, 2013

(30) Foreign Application Priority Data

Aug. 23, 2011 (KR) ........................ 10-2011-0084137

(51) Int. Cl.
*G11C 11/00* (2006.01)
*G11C 13/00* (2006.01)

(52) U.S. Cl.
CPC .... *G11C 13/0004* (2013.01); *G11C 2013/0092* (2013.01); *G11C 13/0069* (2013.01); *G11C 13/0007* (2013.01); *G11C 2013/0076* (2013.01); *G11C 13/0023* (2013.01); *G11C 13/0038* (2013.01)
USPC ....... 365/148; 365/163; 365/191; 365/210.11

(58) Field of Classification Search
CPC ........ G11C 11/00; G11C 11/02; G11C 13/00; G11C 16/06; G11C 16/10; G11C 7/06
USPC ............................ 365/148, 163, 191, 210.11
See application file for complete search history.

(56) References Cited

U.S. PATENT DOCUMENTS

| | | | | |
|---|---|---|---|---|
| 7,110,286 | B2 | 9/2006 | Choi et al. | |
| 7,471,553 | B2 | 12/2008 | Lee et al. | |
| 7,768,822 | B2 * | 8/2010 | Sheu et al. | 365/163 |
| 8,331,183 | B2 * | 12/2012 | Lee et al. | 365/211 |
| 2008/0266942 | A1 * | 10/2008 | Jeong et al. | 365/163 |
| 2010/0103726 | A1 * | 4/2010 | Bae et al. | 365/163 |
| 2010/0124104 | A1 | 5/2010 | Sato et al. | |
| 2011/0122684 | A1 * | 5/2011 | Sheu et al. | 365/163 |

* cited by examiner

*Primary Examiner* — Toan Le

(74) *Attorney, Agent, or Firm* — Volentine & Whitt, PLLC

(57) ABSTRACT

A circuit for generating a write signal includes a pre-emphasis signal generator that receives location information of a to-be-programmed memory cell and generates a pre-emphasis signal depending on the location information of the to-be-programmed memory cell, and a write driver that generates a program signal corresponding to data to be programmed in the to-be-programmed memory cell. A write signal is generated by combining the program signal with the pre-emphasis signal supplied from the pre-emphasis signal generator, and the write signal output to the to-be-programmed memory cell.

19 Claims, 16 Drawing Sheets

100
110
MEMORY CELL ARRAY
120
BL SELECTION CIRCUIT
BL
DL
Ipgm+Ipre
130
WRITE DRIVE
140
SENSE AMP
150
Data Buffer
Ipre
160
PRE-EMPHASIS GENERATOR
180
170
ADDRESS DECODER
WL
Yi
Lc
ADDR (a)
1331
(b)
1331
(c)
1331
(d)
1331
(e)
1331
(f)
(g)
1331
(h)
1331
(i)
1331
(j)
1331

1300
CMOS IMAGER
1332
I/O DEVICE
1336
RAM
1348
1352
CPU
1344
NVM
1354

CIRCUIT FOR GENERATING WRITE SIGNAL, VARIABLE RESISTANCE MEMORY DEVICE, AND METHOD FOR PROGRAMMING VARIABLE RESISTANCE MEMORY

CROSS-REFERENCE TO RELATED APPLICATION

A claim of priority under 35 U.S.C. §119 is made to Korean Patent Application No. 10-2011-0084137, filed on Aug. 23, 2011, in the Korean Intellectual Property Office, the disclosure of which is herein incorporated by reference in its entirety.

BACKGROUND

The inventive concepts generally relate to memory devices, and more particularly, the inventive concepts relate to circuits for generating a write signal, variable resistance memory devices, and methods of operating variable resistance memory devices.

Semiconductor memory devices are storage devices for storing data and for reading the stored data when necessary. Semiconductor memory devices are generally classified as either a nonvolatile memory that retains stored data in the absence of supplied power, or a volatile memory (VM) that loses stored data when power supply is interrupted. Example of nonvolatile memory include flash memory, such as NOR flash memory and a NAND flash memory. Examples of volatile memory include dynamic random access memory (DRAM) and static random access memory (SRAM).

In the meantime, variable resistance memory devices are memory devices that rely on a programmable change in resistance of a memory cell material to denote stored data. Examples of variable resistance memory devices include magnetic RAMs (MRAMs) employing tunneling magneto-resistive (TMR) films to implement variable resistance, phase change memories (PRAMs) using chalcogenide alloys to implement variable resistance, and resistive RAMs using a resistance change of a resistance change film to implement variable resistance.

SUMMARY

According to an aspect of the present inventive concepts, there is provided a circuit for generating a write signal. The circuit includes a pre-emphasis signal generator that receives location information of a to-be-programmed memory cell and generates a pre-emphasis signal depending on the location information of the to-be-programmed memory cell. The circuit further includes a write driver that generates a program signal corresponding to data to be programmed in the to-be-programmed memory cell, generates a write signal by combining the program signal with the pre-emphasis signal supplied from the pre-emphasis signal generator, and outputs the write signal to the to-be-programmed memory cell.

According to another aspect of the present inventive concepts, there is provided a variable resistance memory device. The device includes a memory cell array including a plurality of variable resistance memory cells, and an address decoder that receives address information and outputs location information of a to-be-programmed memory cell among the plurality of variable resistance memory cells. The device further includes a pre-emphasis signal generator that receives the location information of the to-be-programmed memory cell from the address decoder and generates a pre-emphasis signal depending on the location information of the to-be-programmed memory cell. The device still further includes a write driver that generates a program signal corresponding to data to be programmed in the to-be-programmed memory cell, generates a write signal by combining the program signal with the pre-emphasis signal supplied from the pre-emphasis signal generator, and outputs the write signal to the to-be-programmed memory cell.

According to yet another aspect of the present inventive concepts, there is provided a method of programming a memory device including a write driver operatively connected to a memory cell array, where the memory cell array includes a plurality of variable resistance memory cells. The method includes generating a write signal in accordance with a write data to be programmed in a to-be-programmed variable resistance memory cell of the memory cell array, and generating a pre-emphasis signal in accordance with a relative location of the to-be-programmed variable resistance memory cell within the memory cell array. The method further includes combining the write signal and the pre-emphasis signal to generate a program signal, and applying the program signal to the to-be-programmed variable resistance memory cell.

BRIEF DESCRIPTION OF THE DRAWINGS

The above and other features and advantages of the present inventive concepts will become readily apparent from the detailed description that follows, with reference to the accompanying drawings, in which.

DETAILED DESCRIPTION OF THE EMBODIMENTS

The present inventive concepts will now be described more fully hereinafter with reference to the accompanying drawings, in which preferred embodiments of the inventive concepts are shown. This inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions is exaggerated for clarity.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or exemplary terms provided herein is intended merely to better illuminate the inventive concepts and is not a limitation on the scope of the inventive concepts unless otherwise specified. Further, unless defined otherwise, all terms defined in generally used dictionaries may not be overly interpreted.

Figure 1:
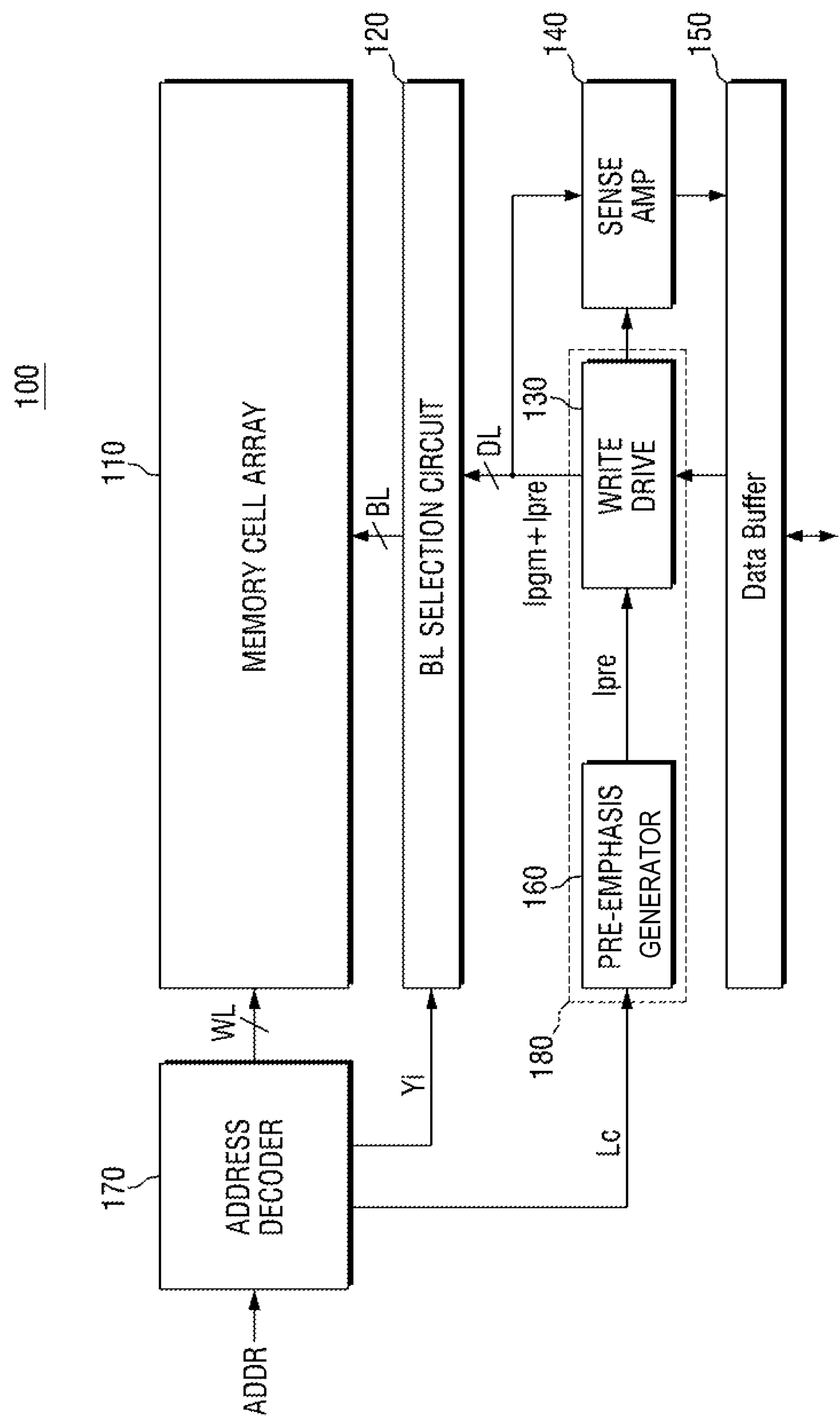
FIG. 1 is a block diagram of a variable resistance memory device according to an embodiment of the present inventive concepts.
Figure 2:
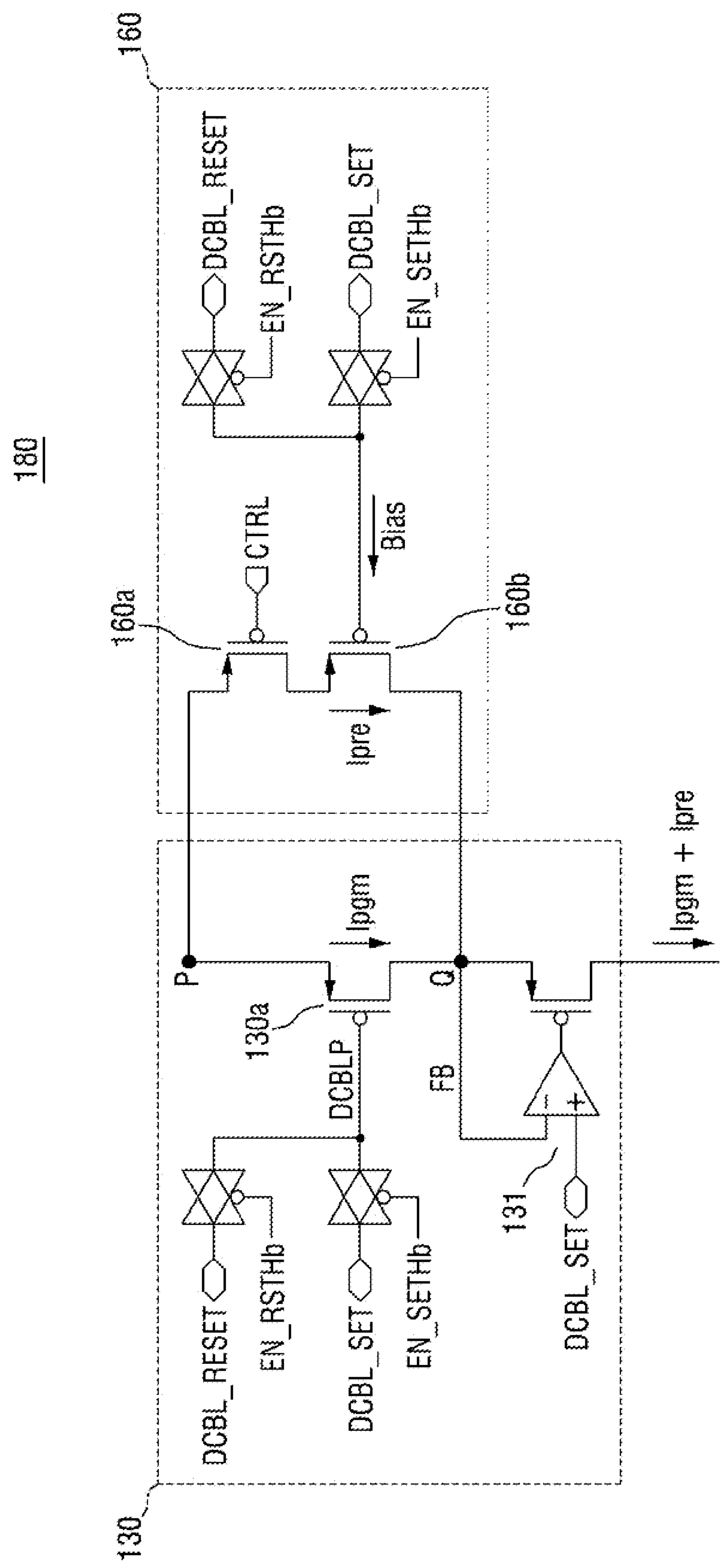
FIG. 2 is circuit diagram of a write signal generator according to an embodiment of the present inventive concepts.
Figure 3:
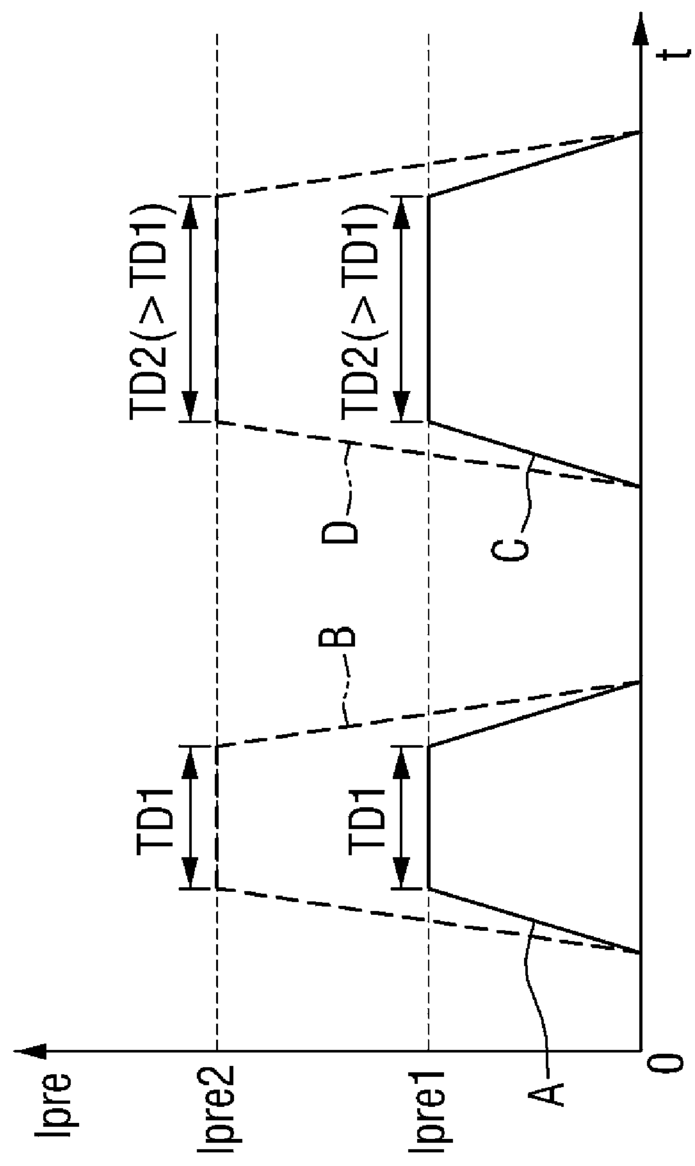
FIG. 3 is a waveform diagram illustrating pre-emphasis signals according to an embodiment of the present inventive concepts.
Figure 4:
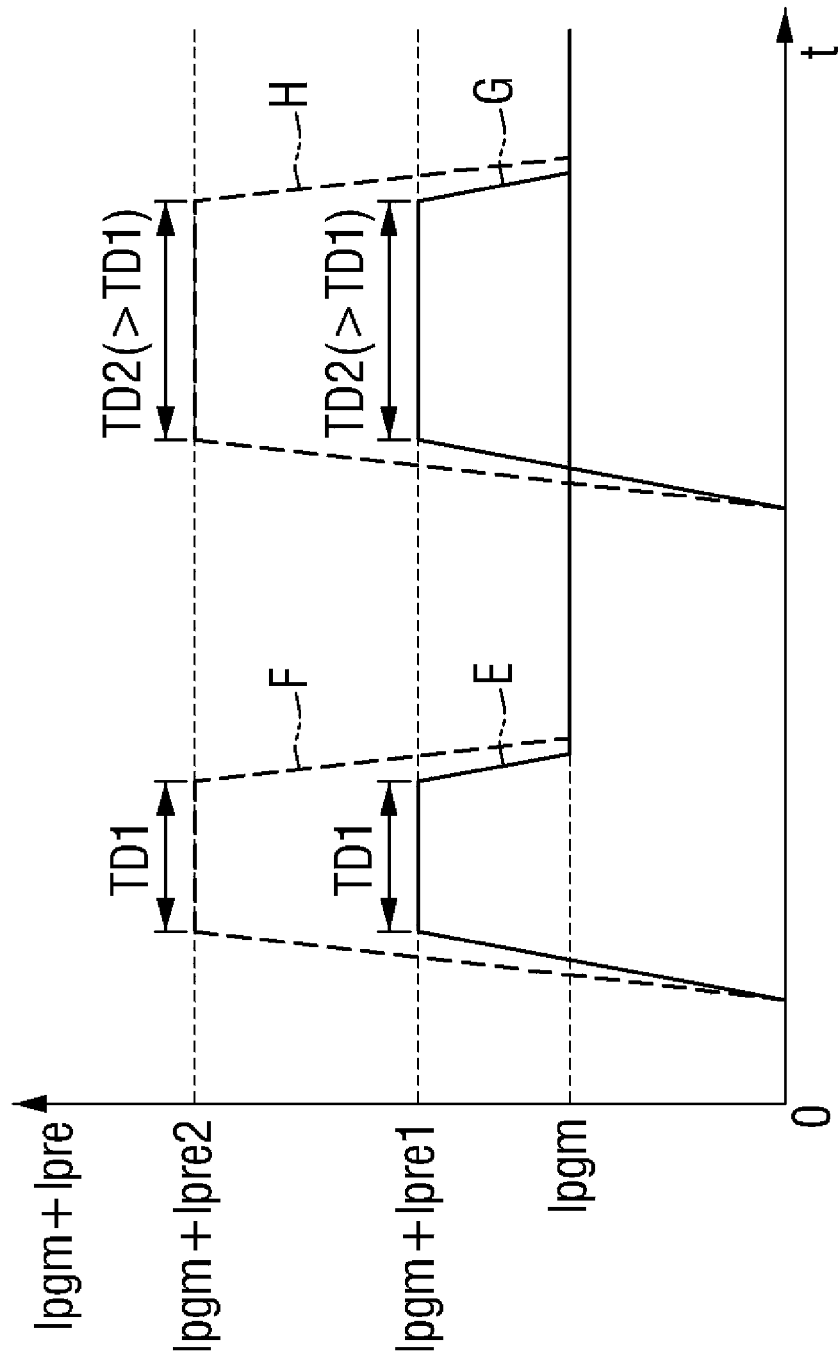
FIG. 4 is a waveform diagram illustrating write signals according to an embodiment of the present inventive concepts.
Figure 5:
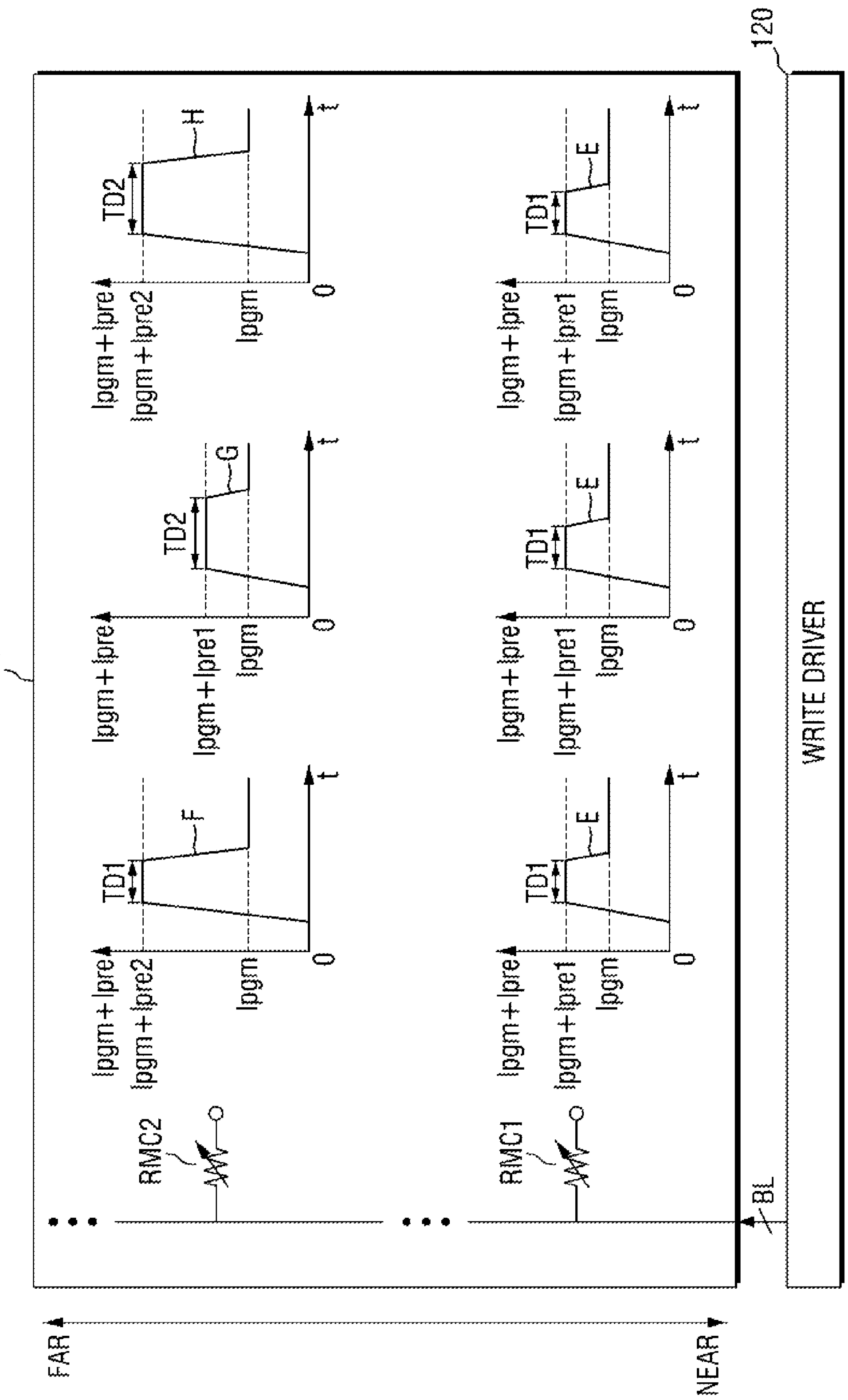
FIG. 5 illustrates the operation of the write signal generator shown in FIG. 2 according to an embodiment of the present inventive concepts.

FIG. 1 is a block diagram of a variable resistance memory device according to an embodiment of the present inventive concepts, FIG. 2 is circuit diagram of a write signal generator of FIG. 1 according to an embodiment of the present inventive concepts, FIG. 3 is a waveform diagram illustrating pre-emphasis signals according to an embodiment of the present inventive concepts, FIG. 4 is a waveform diagram illustrating write signals according to an embodiment of the present inventive concepts, and FIG. 5 illustrates the operation of the write signal generator of FIG. 2 according to an embodiment of the present inventive concepts.

Hereinafter, exemplary embodiments of the present inventive concepts will be described with regard to a variable resistance memory device, specifically a phase change memory device, but aspects of the present inventive concepts are not limited thereto. The inventive concepts may also be applied to other types of variable resistance memory devices, for example, MRAM or RRAM devices.

In addition, a program signal, a pre-emphasis signal, and a write signal, for example, are implemented as a program current, a pre-emphasis current, and a write current in the description that follows, but aspects of the present inventive concepts are not limited thereto. That is to say, if necessary or desired, one or more of the program signal, the pre-emphasis signal, and the write signal of the present inventive concepts may be implemented as a program voltage, a pre-emphasis voltage, and a write voltage, respectfully.

Referring to FIG. 1, the variable resistance memory device 100 includes a memory cell array 110, a bit line (BL) select circuit 120, a sense amp circuit 140, a data input/output buffer circuit 150, an address decoder 170, and a write signal generator 180.

Each memory cell of the memory cell array 110 includes an array of variable resistance memory cells. In particular, according to this embodiment, the variable resistance memory cells are phase change memory cells, but as mentioned above, the inventive concepts are not limited in this respect.

Although not shown in detail, each memory cell in the memory cell array 110 may include a memory element and a select element. In the present embodiment, the memory element includes a phase change material such as germanium-antimony-tellurium (Ge—Sb—Te, also referred to as "GST"), which functions as a variable resistor (i.e., resistance being variable with heat), and the select element may be implemented as an NMOS transistor or a diode.

The phase change material (GST) is conditioned in one of at least two stable states, i.e., a crystalline state (e.g., a 'SET' state) or an amorphous state (e.g., a 'RESET' state). The crystalline state exhibits a lower resistance than the amorphous state, allowing these states to be distinguished according to a read current applied to the GST material.

More specifically, phase change material (GST) becomes the high-resistance amorphous state, that is, the 'RESET' state, when a reset current is applied to the phase change memory cell through a bit line BL, to represent that particular data (e.g., 1) is stored. On the other hand, the phase change material is becomes the low-resistance crystalline state, that is, the 'SET' state, when a set current is applied to the phase change memory cell through the bit line BL, to represent that different data (e.g., 0) is stored.

The address decoder 170 is connected to the memory cell array 110 through a word line (WL). The address decoder 170 decodes an externally input address (ADDR) and supplies a bias voltage to a selected word line. In addition, the address decoder 170 generates a select signal (Yi) for selecting the bit line BL and supplies the generated select signal to the bit line select circuit 120.

The bit line select circuit 120 is connected to the memory cell array 110 through the bit line BL. During read and program operations, the bit line select circuit 120 selects the bit line BL of the memory cell array 110 in response to the select signal Yi supplied from the address decoder 170. The bit line select circuit 120 may include a plurality of NMOS transistors, and the NMOS transistors may electrically connect bit line BL and the data line DL in response to the select signal Yi.

The write signal generator 180 receives data to be programmed in the to-be-programmed memory cell from the data input/output buffer circuit 150, and generates a write current corresponding thereto, the write current to then be output to the to-be-programmed memory cell of the memory cell array 110. In particular, the write signal generator 180 according to the present inventive concepts receives location information (Lc) of the to-be-programmed memory cell in the memory cell array 110 from the address decoder 170, generates a write current (Ipgm+Ipre) of varying magnitude or pulse width, and outputs the write current to the to-be-programmed memory cell of the memory cell array 110, which will later be described in more detail.

While FIG. 1 shows that the write signal generator 180 receives the location information Lc of the to-be-programmed memory cell in the memory cell array 110 from the address decoder 170, aspects of the present inventive concepts are not limited thereto. That is to say, the write signal generator 180 may receive location information Lc from a circuit other than the address decoder 170 or may receive location information Lc directly from an external source.

During a read operation, the sense amp circuit 140 reads data stored in the memory cell of the memory cell array 110 and outputs the same to the data input/output buffer circuit 150. In addition, during a program verify operation, the sense amp circuit 140 reads the data stored in the memory cell and performs the program verify operation.

The operations of the write signal generator 180 and the sense & amp circuit 140 may be controlled by control signals of generated by control logic (not shown).

Next, referring to FIGS. 1 and 2, the write signal generator 180 includes a pre-emphasis signal generator 160 that receives the location information (Lc) of the to-be-programmed memory cell and generates a pre-emphasis current (Ipre) depending on the location information (Lc) of the to-be-programmed memory cell, and a write driver 130 that generates a program current (Ipgm) corresponding to data to be programmed to the to-be-programmed memory cell, generates a write signal (Ipgm+Ipre) by combining the same with the pre-emphasis current (Ipre) supplied from the pre-emphasis signal generator 160, and outputs the write signal (Ipgm+Ipre) to the to-be-programmed memory cell.

First, the write driver 130 receives the data to be programmed in the to-be-programmed memory cell from the data input/output buffer circuit 150 and generates the program current (Ipgm) corresponding thereto. For example, if the data to be programmed in the to-be-programmed memory cell is '0,' a SET bias is applied to the write driver 130 to generate the program current (Ipgm) as a set current. On the contrary, if the data to be programmed in the to-be-programmed memory cell is '1,' a RESET bias is applied to the write driver 130 to generate the program current (Ipgm) as a reset current. Here, a predetermined voltage to generate the program current (Ipgm) is maintained at opposite ends P and Q of the program current generator 130*a*.

Meanwhile, the pre-emphasis signal generator 180 may include a signal width adjusting unit 160*a* that adjusts a pulse width (TD) of the pre-emphasis signal (Ipre) according to the time in which the control signal (CTRL) is applied, and a signal magnitude adjusting unit 160*b* that adjusts a magnitude of the pre-emphasis signal (Ipre) according to the magnitude of a bias signal (that is, according to whether the bias signal applied is a RESET bias or a SET bias) pre-emphasis signal (Ipre). That is to say, the pre-emphasis signal generator 180 according to the present inventive concepts may generate the pre-emphasis signal (Ipre) having various pulse widths (TD) and magnitudes according to the time in which the control signal (CTRL) is applied and the magnitude of the bias signal.

For example, referring to FIGS. 2 and 3, the pre-emphasis signal generator 180 may generate a first pre-emphasis current (A) having a first pulse width (TD1) and a first magnitude (Ipre1), a second pre-emphasis current (B) having the first pulse width (TD1) and a second magnitude (Ipre2), a third pre-emphasis current (C) having a second pulse width (TD2) and the first magnitude (Ipre1), and a fourth pre-emphasis current (D) having the second pulse width (TD2) and the second magnitude (Ipre2) by varying the time in which the control signal (CTRL) is applied to the signal width adjusting unit 160*a* and the magnitude of the bias applied to the signal magnitude adjusting unit 160*b*.

The pre-emphasis current (Ipre), which is generated according to one of various types as described above, is combined with the program current (Ipgm) generated from the write driver 130 to then be generated as one of various types of write current (Ipgm+Ipre). For example, if the first to fourth pre-emphasis currents (A~D of FIG. 3) are generated from the pre-emphasis signal generator 160, the write driver 130 may generate a first write current (E) having a first width (TD1 and a first magnitude (Ipgm+Ipre1), a second write current (F) having the first width (TD1) and a second magnitude (Ipgm+Ipre2), a third write current (G) having a second width (TD2) and the first magnitude (Ipgm+Ipre1) and a fourth write current (H) having the second width (TD2) and the second magnitude (Ipgm+Ipre2), as shown in FIG. 4.

In the meantime, the write driver 130 may include a feedback amplifier 131 for enhancing the stability in which the write current (Ipgm+Ipre) is generated.

When the write current (Ipgm+Ipre) having one of various pulse widths and magnitudes is generated, the write driver 130 outputs the generated write current (Ipgm+Ipre) to the to-be-programmed memory cell in the memory cell array 110.

Referring to FIG. 5, a plurality of memory cells RMC1 and RMC2 are provided in the memory cell array 110. Among the plurality of memory cells RMC1 and RMC2, the first memory cell RMC1 may be formed to be nearer to the write driver 120 than to the second memory cell RMC2. In other words, the second memory cell RMC2 may be formed to be farther from the write driver 120 than the first memory cell RMC1.

In this embodiment, as the to-be-programmed memory cell is situated relatively far from the write driver 130, the pre-emphasis signal generator 160 increases the magnitude and/or pulse width of the pre-emphasis current (Ipre). That is to say, in the specific example of this embodiment, if the to-be-programmed memory cell is the first memory cell RMC1, the pre-emphasis signal generator 160 generates the first pre-emphasis current (A) having the first pulse width (TD1) and the first magnitude (Ipre1). If the to-be-programmed memory cell is the second memory cell RMC2 positioned farther from the write driver 120 than the first memory cell RMC1, the pre-emphasis signal generator 160 may generate the second pre-emphasis current (B) having a larger magnitude than the first pre-emphasis current (A), the third pre-emphasis current (C) having a larger pulse width than the first pre-emphasis current (A), or the fourth pre-emphasis current (D) having a larger magnitude and a larger pulse width than the first pre-emphasis current (A).

Referring in particular to FIG. 4, the write driver 120 outputs the first write current (E) to program the first memory cell RMC1. In order for the write driver 120 to program the second memory cell RMC2, the write driver 120 outputs one of the second to fourth write currents (F~H) having a larger pulse width and/or magnitude than the first write current (E).

As described above, write currents (Ipgm+Ipre) having different pulse widths or magnitudes are selectively used according to the positions of the to-be-programmed memory cells relative to the write driver 120. As a memory device becomes highly integrated, RC delay may gradually increase in internal wires (for example, a bit line). To overcome this, the magnitude and/or pulse width of the write current is conventionally generated based on worse-case memory cell characteristics, which can result in relatively long set-up time and a relatively slow write speed.

The current embodiment of the present inventive concepts, however, allow for a reduction in overall set-up time (and thus increased average write speed) since a write current having a relatively small pulse width and/or magnitude is applied to a memory cell that is near to the write driver 120, which is affected to a lesser degree by RC delay.

Figure 6:
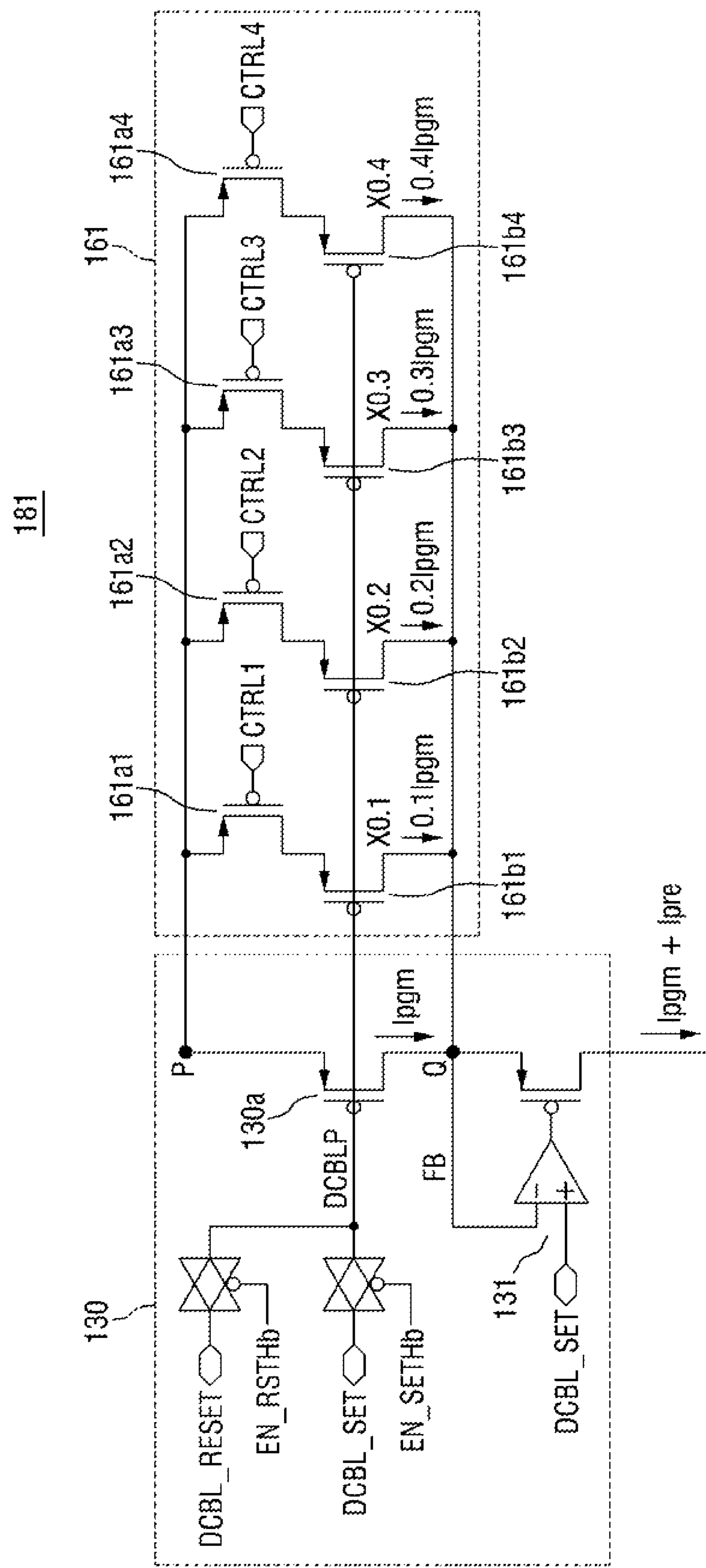
FIG. 6 is circuit diagram of a write signal generator according to another embodiment of the present inventive concepts.
Figure 7:
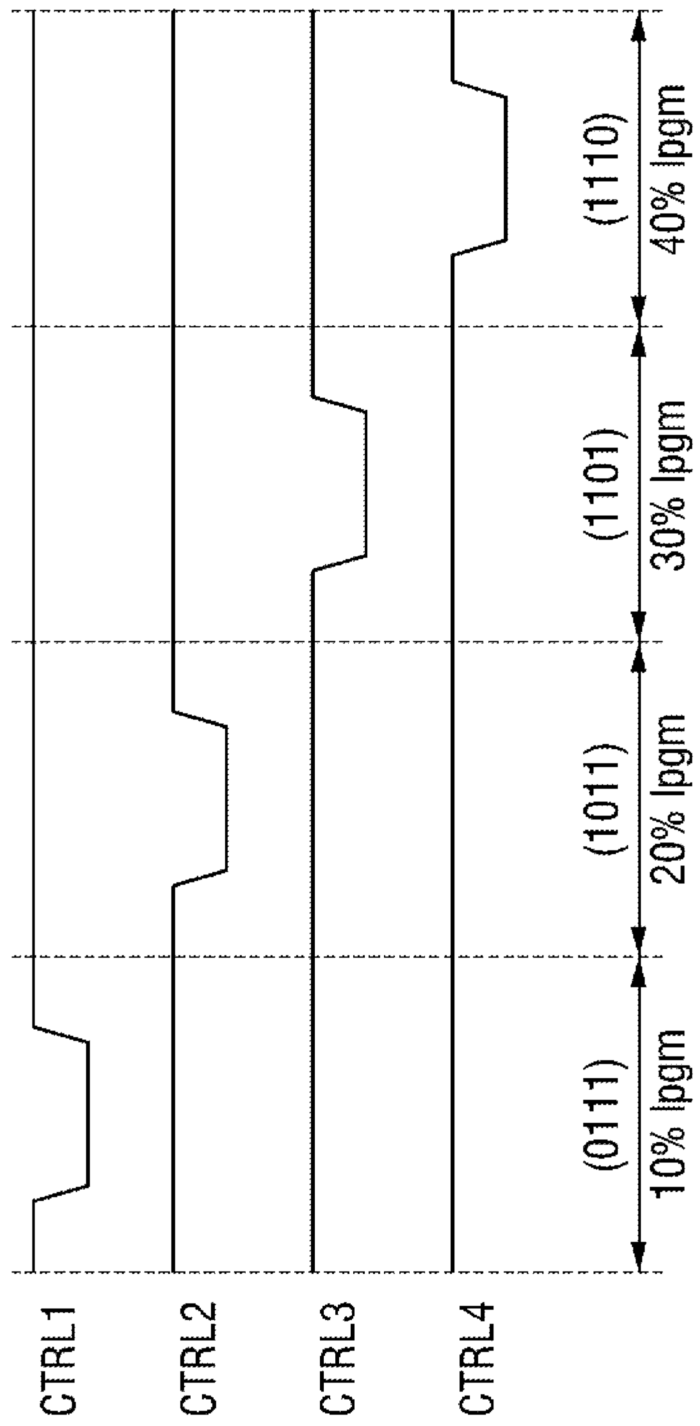
FIG. 7 illustrates combinations of control signals applied to the write signal generator shown in FIG. 6.

FIG. 6 is circuit diagram of a write signal generator according to another embodiment of the present inventive concepts, and FIG. 7 illustrates combinations of control signals applied to the write signal generator shown in FIG. 6.

Hereinafter, the write signal generator 181 according to another embodiment of the present inventive concepts will be described. Descriptions of the same components as those of the previous embodiment will not be repeated and instead the following description will focus on differences between the previous and current embodiments of the present inventive concepts.

Referring to FIG. 6, a pre-emphasis signal generator 161 of the write signal generator 181 adjusts a magnitude of a pre-emphasis current (Ipre) by linear decoding.

In detail, the pre-emphasis signal generator 161 may include a plurality of pre-emphasis signal magnitude adjusting transistors 161*b*1 to 161*b*4 having different channel widths X0.1 to X0.4. Here, the channel widths of the respective pre-emphasis signal magnitude adjusting transistors 161*b*1 to 161*b*4 may be smaller than channel widths of transistors constituting the program current generator 130*a*. For example, the channel width of the first pre-emphasis signal magnitude adjusting transistor 161*b*1 may be 1/10 the channel width of the transistor of the program current generator 130*a*, the channel width of the second pre-emphasis signal magnitude adjusting transistor 161*b*2 may be 2/10 the channel width of the transistor of the program current generator 130*a*, the width of the third pre-emphasis signal magnitude adjusting transistor 161*b*3 may be 3/10 the channel width of the transistor of the program current generator 130*a*, and the width of the fourth pre-emphasis signal magnitude adjusting transistor 161*b*4 may be 4/10 the channel width of the transistor of the program current generator 130*a*.

Meanwhile, the pre-emphasis signal generator 161 may include first to fourth switch transistors 161*a*1 to 161*a*4 which are turned on according to whether or not first to fourth control signals CTRL1 to CTRL4 are applied. In the current embodiment, the first to fourth control signals CTRL1 to CTRL4 may form a multi-bit (e.g., 4-bit) digital control signal, which has a value that varies according to the location information Lc of the to-be-programmed memory cell in the memory cell array 110, which will be described below in more detail with additional reference to FIG. 7.

First, in order for the write driver 130 to generate the program current (Ipgm), if the program current generator 130*a* is turned on, the first to fourth pre-emphasis signal magnitude adjusting transistors 161*b*1 to 161*b*4 connected to the program current generator 130*a* are all turned on. Here, a predetermined voltage is maintained at opposite ends P and Q of the program current generator 130*a* to generate the program current (Ipgm).

Here, if '0111' is applied as the digital control signal (that is, if 0 is applied as the first control signal, and 1 is applied as the second to fourth control signals), the first switch transistor 161*a*1 is turned on and the second to fourth switch transistors 161*a*2 to 161*a*4 are turned off. Here, since the width of the first pre-emphasis signal magnitude adjusting transistor 161*b*1 is 1/10 the channel width of the transistor constituting the program current generator 130*a*, the pre-emphasis signal generator 181 generates the pre-emphasis current (Ipre=0.1 Ipgm) having a magnitude of 10% the program current (Ipgm), and the write driver 130 finally outputs the write current (Ipgm+Ipre=1.1 Ipgm) of 1.1 times Ipgm to the to-be-programmed memory cell.

Figure 8:
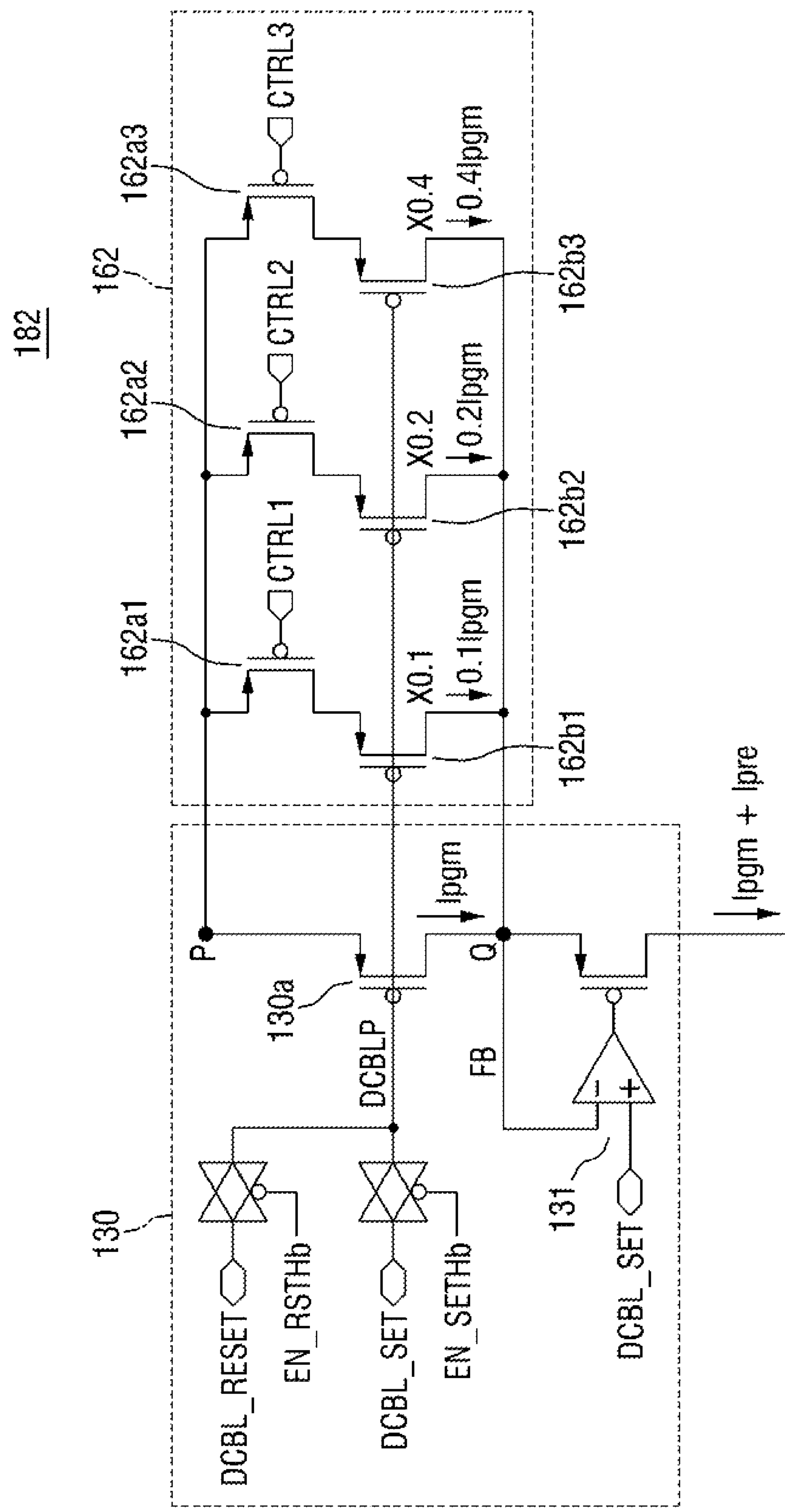
FIG. 8 is circuit diagram of a write signal generator according to still another embodiment of the present inventive concepts.
Figure 9:
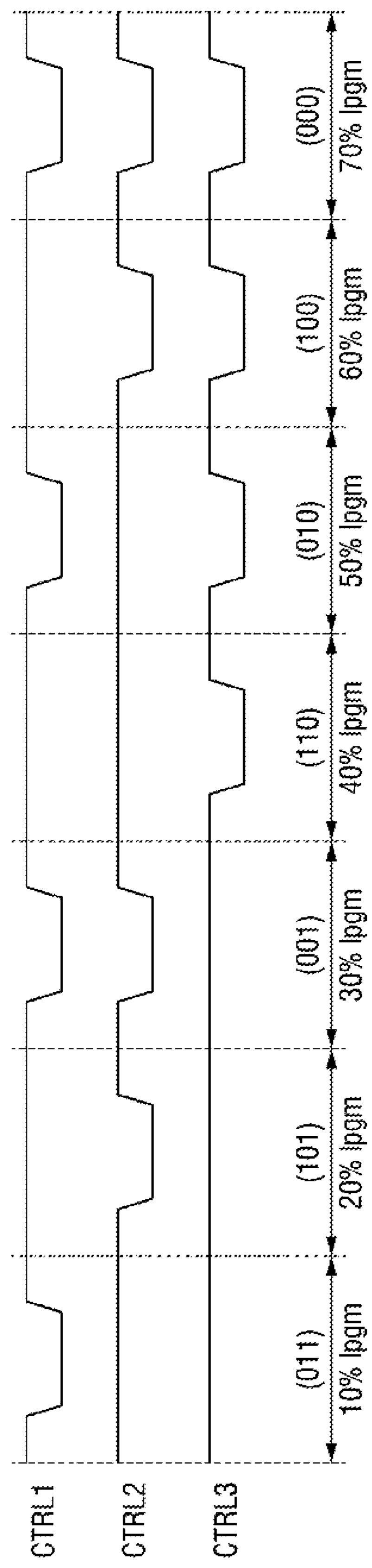
FIG. 9 illustrates combinations of control signals applied to the write signal generator shown in FIG. 8.

FIG. 8 is circuit diagram of a write signal generator according to still another embodiment of the present inventive concepts, and FIG. 9 illustrates combinations of control signals applied to the write signal generator shown in FIG. 8.

Hereinafter, the write signal generator 182 according to still another embodiment of the present inventive concepts will be described. Descriptions of the same components as those of the previous embodiment will not be repeated, and the following description will instead focus on differences between the previous and current embodiments of the present inventive concepts.

Referring to FIG. 8, a pre-emphasis signal generator 162 of the write signal generator 182 adjusts a magnitude of a pre-emphasis current (Ipre) by linear decoding.

In detail, the pre-emphasis signal generator 162 may include a plurality of pre-emphasis signal magnitude adjusting transistors 162*b*1 to 162*b*3 having different widths X0.1, X0.2 and X0.4. For example, the width of the first pre-emphasis signal magnitude adjusting transistor 162*b*1 may be 1/10 the channel width of the transistor of the program current generator 130*a*, the width of the second pre-emphasis signal magnitude adjusting transistor 162*b*2 may be 2/10 the channel width of the transistor of the program current generator 130*a*, and the width of the third pre-emphasis signal magnitude adjusting transistor 162*b*3 may be 4/10 the channel width of the transistor of the program current generator 130*a*.

The pre-emphasis signal generator 162 may include first to third switch transistors 162*a*1 to 162*a*3 which are turned on according to whether or not first to third control signals CTRL1 to CTRL3 are applied, which will be described below in more detail with additional reference to FIG. 9.

If '011' is applied to the pre-emphasis signal generator 162 as a multi-bit (e.g., 3-bit) digital control signal, the first switch transistor 162*a*1 is turned on, and the second and third switch transistors 162*a*2 and 162*a*3 are turned off. Since the first to third pre-emphasis signal magnitude adjusting transistors 162*b*1 to 162*b*3 connected to the program current generator 130*a* are all turned on and a predetermined voltage is maintained at opposite ends P and Q of the program current generator 130*a* to generate the program current (Ipgm), the pre-emphasis signal generator 162 may generate the pre-emphasis current (Ipre=0.1 Ipgm) having a magnitude of 10% the program current (Ipgm).

On the other hand, if '001' is applied to the pre-emphasis signal generator 162 as the digital control signal, the first and second switch transistors 162*a*1 and 162*a*2 are turned on, and the third switch transistor 162*a*3 is turned off. Similarly, the first to third pre-emphasis signal magnitude adjusting transistors 162*b*1 to 162*b*3 connected to the program current generator 130*a* are all turned on and a predetermined voltage is maintained at opposite ends P and Q of the program current generator 130*a* to generate the program current (Ipgm). Therefore, the pre-emphasis signal generator 162 may generate a pre-emphasis current (Ipre=0.1 Ipgm) having a magnitude of 10% the program current (Ipgm) through the first switch transistor 162*a*1 and the first pre-emphasis signal magnitude adjusting transistor 162*b*1. In addition, the pre-emphasis signal generator 162 may generate a pre-emphasis current (Ipre=0.2 Ipgm) having a magnitude of 20% the program current (Ipgm) through the second switch transistor 162*a*2 and the second pre-emphasis signal magnitude adjusting transistor 162*b*2. Finally, the pre-emphasis signal generator 162 may generate a pre-emphasis current (Ipre=0.3 Ipgm) having a magnitude of 30% the program current (Ipgm) by combining the pre-emphasis current (Ipre=0.1 Ipgm) and the pre-emphasis current (Ipre=0.2 Ipgm) to then provide the combined current to the write driver 130.

As described above, by using the first to third control signals CTRL1 to CTRL3 to set on/off combinations the first to third switch transistors 162*a*1 to 162*a*3, the pre-emphasis signal generator 162 may generate pre-emphasis currents (Ipre) having magnitudes of 10% to 70% the program current (Ipgm) as shown in FIG. 9.

Next, as described previously, the write driver 130 outputs a write current (e.g., 1.1 Ipgm) having a relatively small magnitude to a memory cell near to the write driver 130 and a write current (e.g., 1.7 Ipgm) having a relatively large magnitude to a memory cell far from the write driver 130, thereby programming the memory cell.

Figure 10:
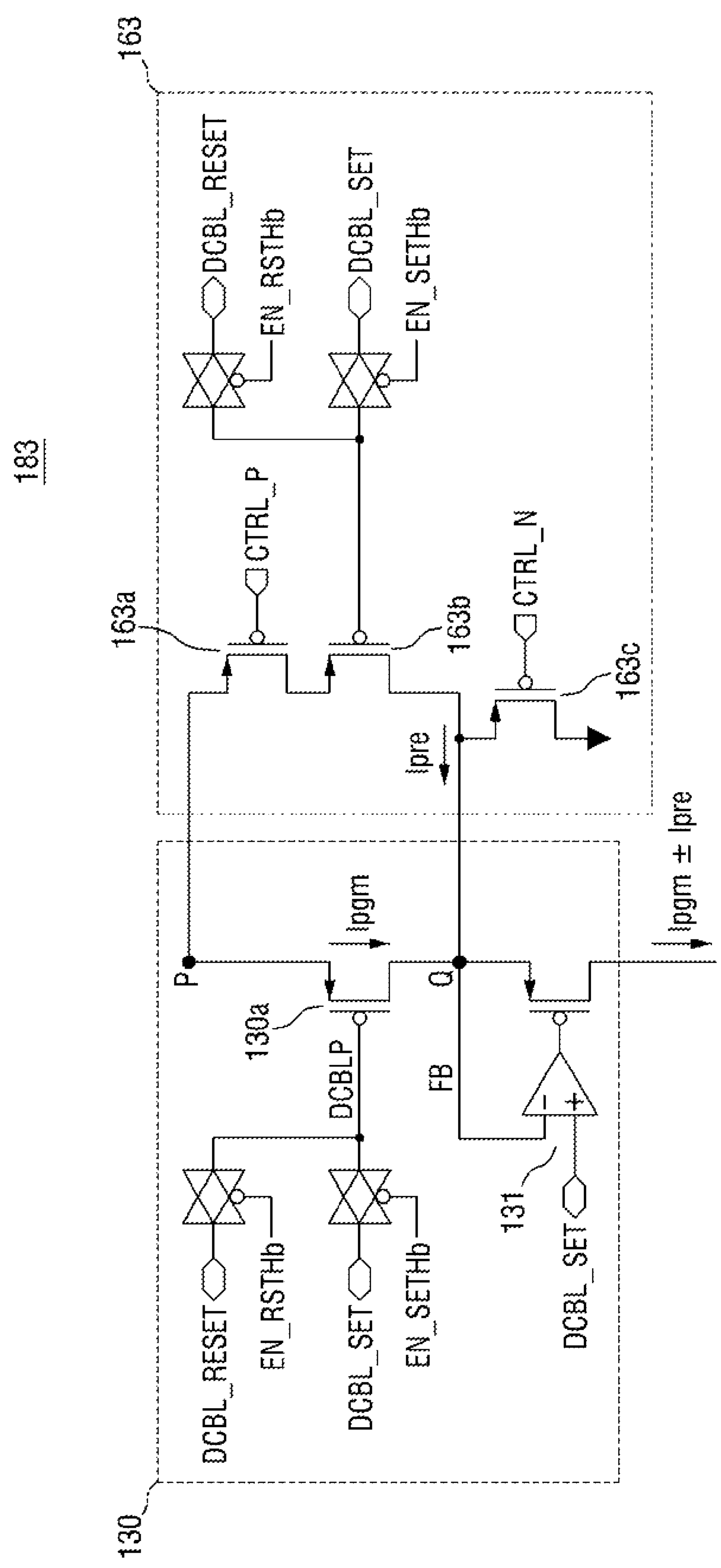
FIG. 10 is circuit diagram of a write signal generator according to still another embodiment of the present inventive concepts.
Figure 11:
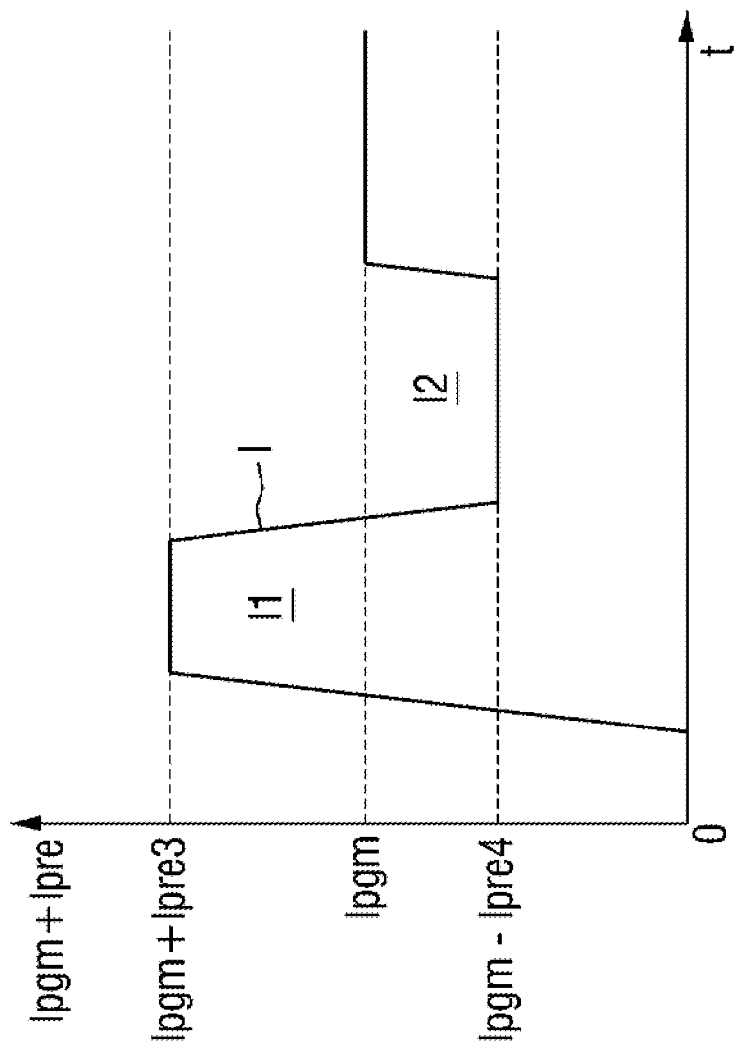
FIG. 11 is a waveform diagram illustrating write signals according to still another embodiment of the present inventive concepts.

FIG. 10 is circuit diagram of a write signal generator according to still another embodiment of the present inventive concepts, and FIG. 11 is a waveform diagram illustrating write signals according to still another embodiment of the present inventive concepts.

Hereinafter, the write signal generator 183 according to still another embodiment of the present inventive concepts will be described. Descriptions of the same components as those of the previous embodiment will not be repeated, and the following description will instead focus on different components between the previous and current embodiments of the present inventive concepts.

Referring to FIG. 10, the pre-emphasis signal generator 163 may further include a signal magnitude reducing unit 163*c* that reduces a magnitude of the program current (Ipgm). In detail, the pre-emphasis signal generator 163 may include the signal magnitude reducing unit 163*c* composed of a ground transistor that receives a negative control signal (CTRL_N) to be turned on and diverts part of the received program current (Ipgm) to the ground terminal.

With this configuration, the write signal generator 183 may generate a write current (I) having a first section (I1) having a larger value (Ipgm+Ipre3) than the program current (Ipgm) shown in FIG. 11, and a second section (I2) having a smaller value (Ipgm-Ipre4) than the program current (Ipgm), which will be described below in more detail with reference to FIGS. 10 and 11.

First, if a positive control signal (CTRL_P) is applied to the pre-emphasis signal generator 163, a write current (I1 section of I) having a magnitude (Ipgm+Ipre3) larger than the program current (Ipgm) is generated through the same operation as described above in the previous embodiment. Here, since a negative control signal (CTRL_N) is not applied to the pre-emphasis signal generator 163, the signal magnitude reducing unit 163*c* is turned off.

Here, if it is necessary to reduce the magnitude of the write current (I), the negative control signal (CTRL_N) is applied to the pre-emphasis signal generator 163. As the negative control signal (CTRL_N) is applied to the pre-emphasis signal generator 163, the signal magnitude reducing unit 163*c* is turned off, so that at least some of the program current (Ipgm) is diverted to the ground terminal through the ground transistor. Therefore, a write current (I2 section of I) having a magnitude (Ipgm-Ipre4) smaller than the program current (Ipgm) may be generated.

While FIG. 10 shows that only the signal magnitude reducing unit 163*c* is additionally provided in the pre-emphasis signal generator (160 of FIG. 2) according to the previous embodiment, many modifications thereof may be made. That is to say, the signal magnitude reducing unit 163*c* may be added to the pre-emphasis signal generators (161 of FIG. 6 and 162 of FIG. 8) according to other embodiments, thereby generating a write current (I) having a first section (I1) having a magnitude (Ipgm+Ipre3) larger than the program current (Ipgm) shown in FIG. 11 and a second section (I2) having a magnitude (Ipgm-Ipre4) smaller than the program current (Ipgm).

Hereinafter, system examples of the applications of variable resistance memory devices according to various embodiments of the present inventive concepts will be described with reference to FIGS. 12 to 16.

Figure 12:
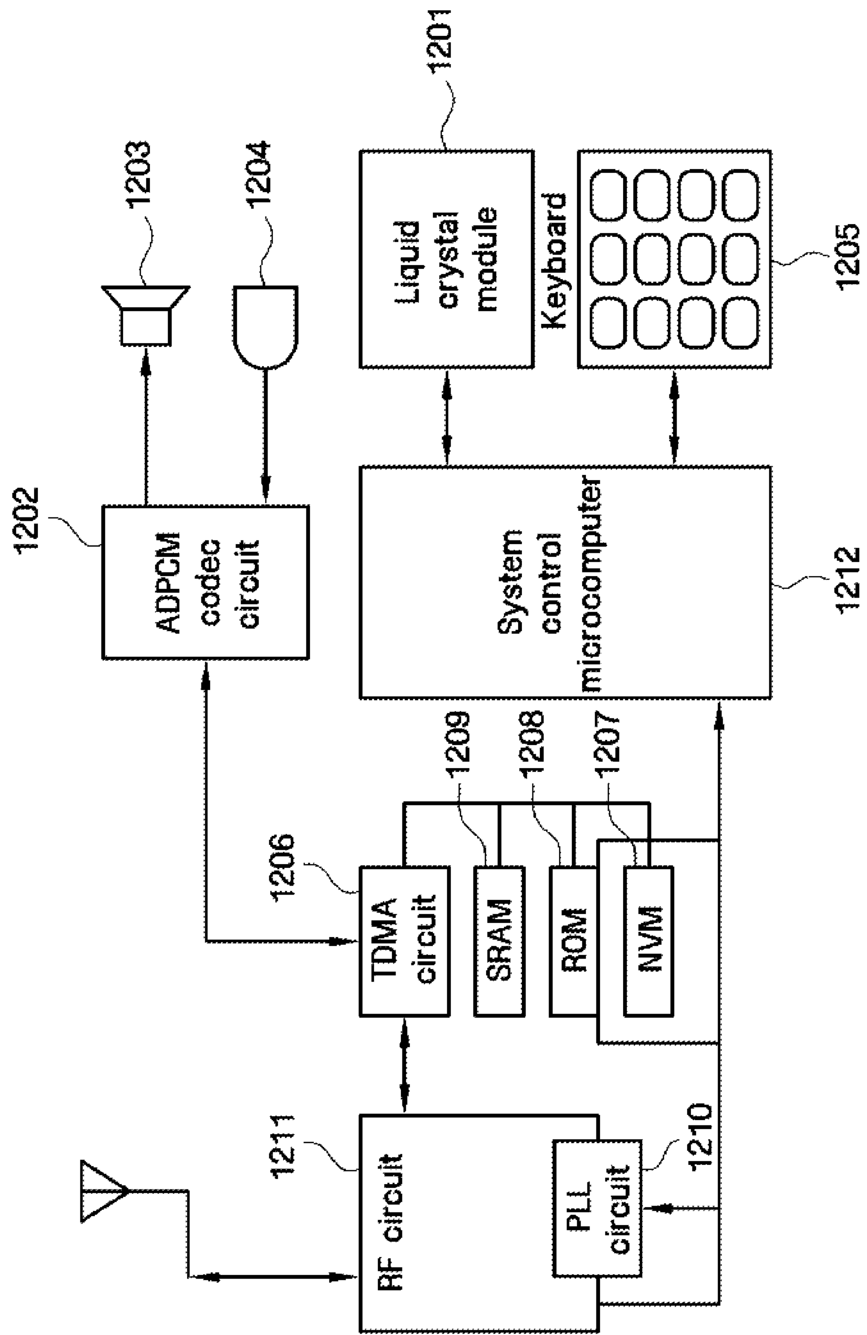
FIGS. 12, 13, 14, 15 and 16 are diagrams illustrating system examples of the applications of variable resistance memory devices according to various embodiments of the present inventive concepts.

FIG. 12 is a diagram illustrating a cellular phone system that uses variable resistance memory devices according to embodiments of the present inventive concepts.

Referring to FIG. 12, the cellular phone system may include an adaptive differential pulse code modulation (ADPCM) codec circuit 1202 which compresses sound or decompresses compressed sound, a speaker 1203, a microphone 1204, a time division multiplex access (TDMA) circuit 1206 which time-division multiplexes digital data, a phase-locked loop (PLL) circuit 1210 which sets a carrier frequency of a wireless signal, and a radio frequency (RF) circuit 1211 which transmits or receives a wireless signal.

In addition, the cellular phone system may include various types of memory devices. For example, the cellular phone system may include a nonvolatile memory device 1207, a read only memory (ROM) 1208, and a static random access memory (SRAM) 1209. The nonvolatile memory device 1207 may be any one of the nonvolatile memory devices according to the embodiments of the present inventive concepts and may store, for example, an identification (ID) number. The ROM 1208 may store programs, and the SRAM 1209 may serve as a work area for a system control microcomputer 1212 or temporarily store data. The system control microcomputer 1212 is a processor and may control a write operation and a read operation of the nonvolatile memory device 1207.

Figure 13:
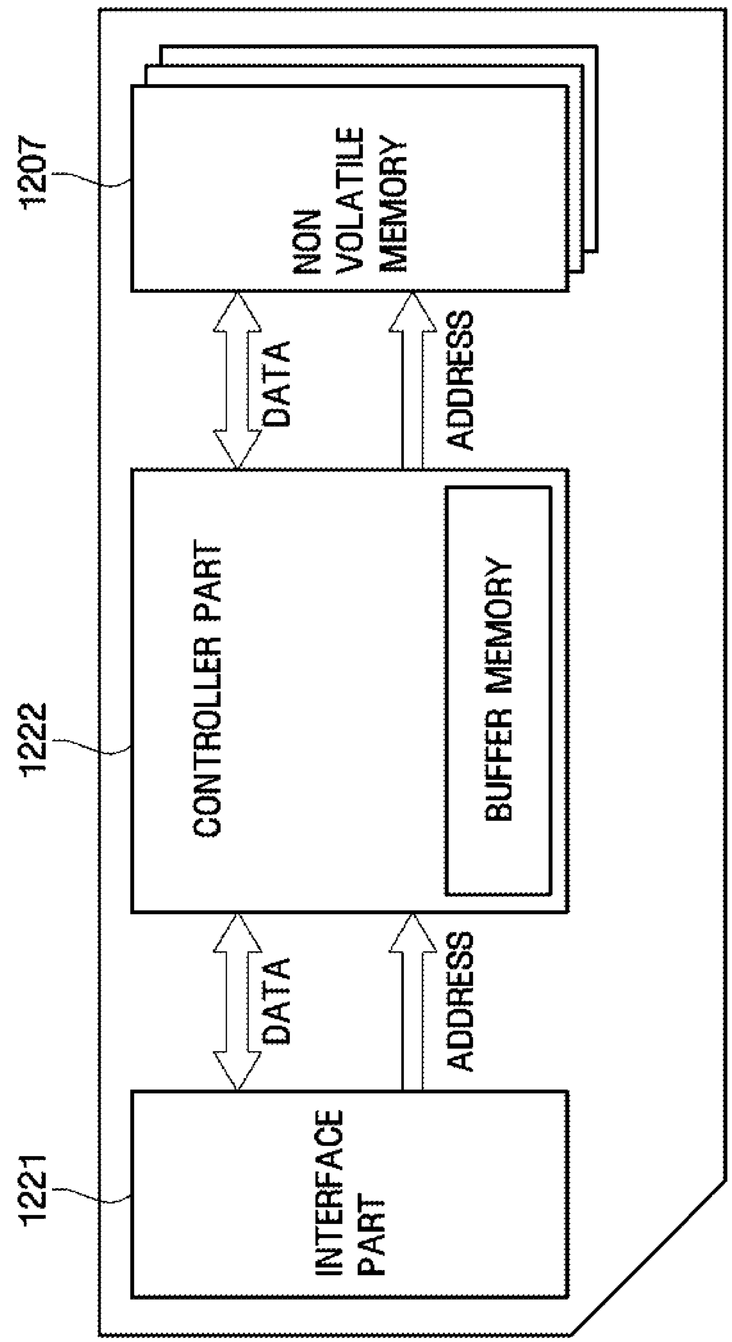

FIG. 13 is a diagram illustrating a memory card which uses variable resistance memory devices according to embodiments of the present inventive concepts. The memory card may be, for example, a multimedia card (MMC), a secure digital (SD) card, a multi-use card, a micro SD card, a memory stick, a compact SD card, an ID card, a personal computer memory card international association (PCMCIA) card, a solid-state drive (SSD) card, a chip card, a smart card, or a universal serial bus (USB) card.

Referring to FIG. 13, the memory card may include an interface part 1221 which interfaces with an external device, a controller part 1222 which includes a buffer memory and controls the operation of the memory card, and one or more non volatile variable resistance memory devices 1207 according to embodiments of the present inventive concepts. The controller part 1222 is a processor and may control the write and read operations of the variable resistance memory device 1207. Specifically, the controller part 1222 is coupled to each of the interface part 2221 and the nonvolatile memory devices 1207 by a data bus DATA and an address bus ADDRESS.

Figure 14:
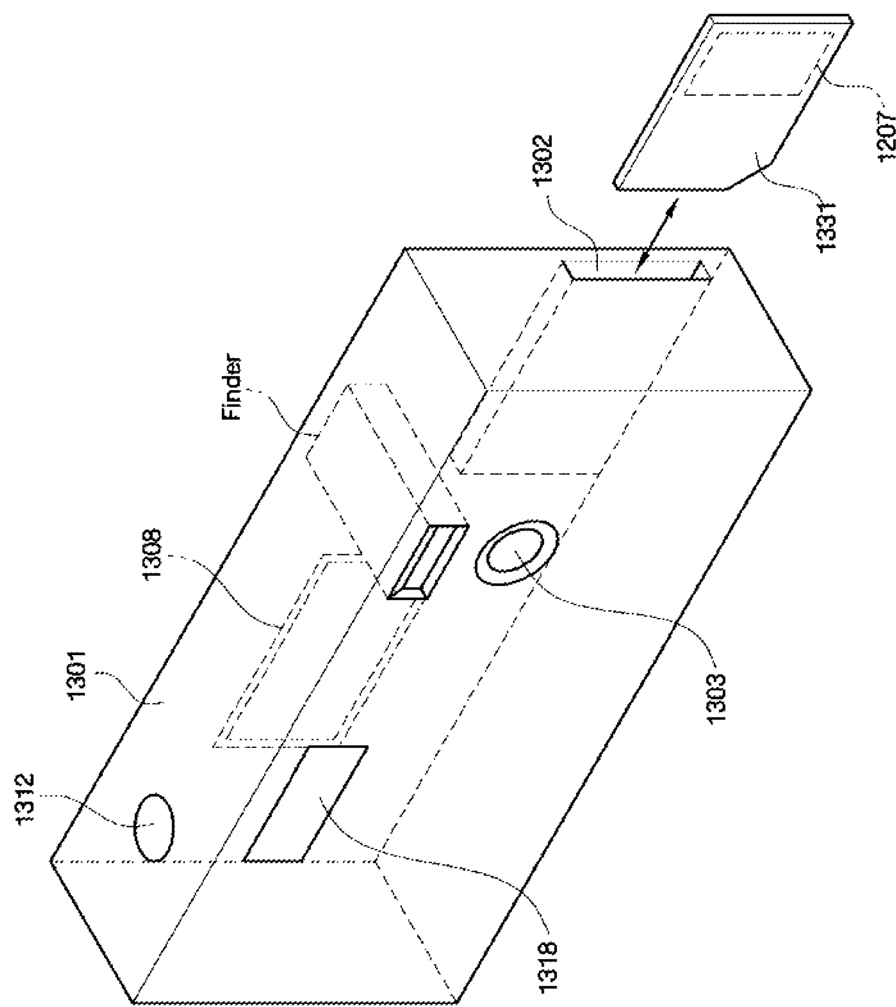

FIG. 14 is a diagram illustrating a digital still camera that uses variable resistance memory devices according to embodiments of the present inventive concepts.

Referring to FIG. 14, the digital still camera includes a body 1301, a slot 1302, a lens 1303, a display 1308, a shutter button 1312, and a strobe 1318. In particular, a memory card 1131 may be inserted into the slot 1302 and include one or more variable resistance memory devices 1207 according to embodiments of the present inventive concepts.

If the memory card 1131 is of a contact type, it electrically contacts a specified electrical circuit on a circuit board when it is inserted into the slot 1308. When the memory card 1131 is of a non-contact type, it communicates with the memory card 1131 using a wireless signal.

Figure 15:
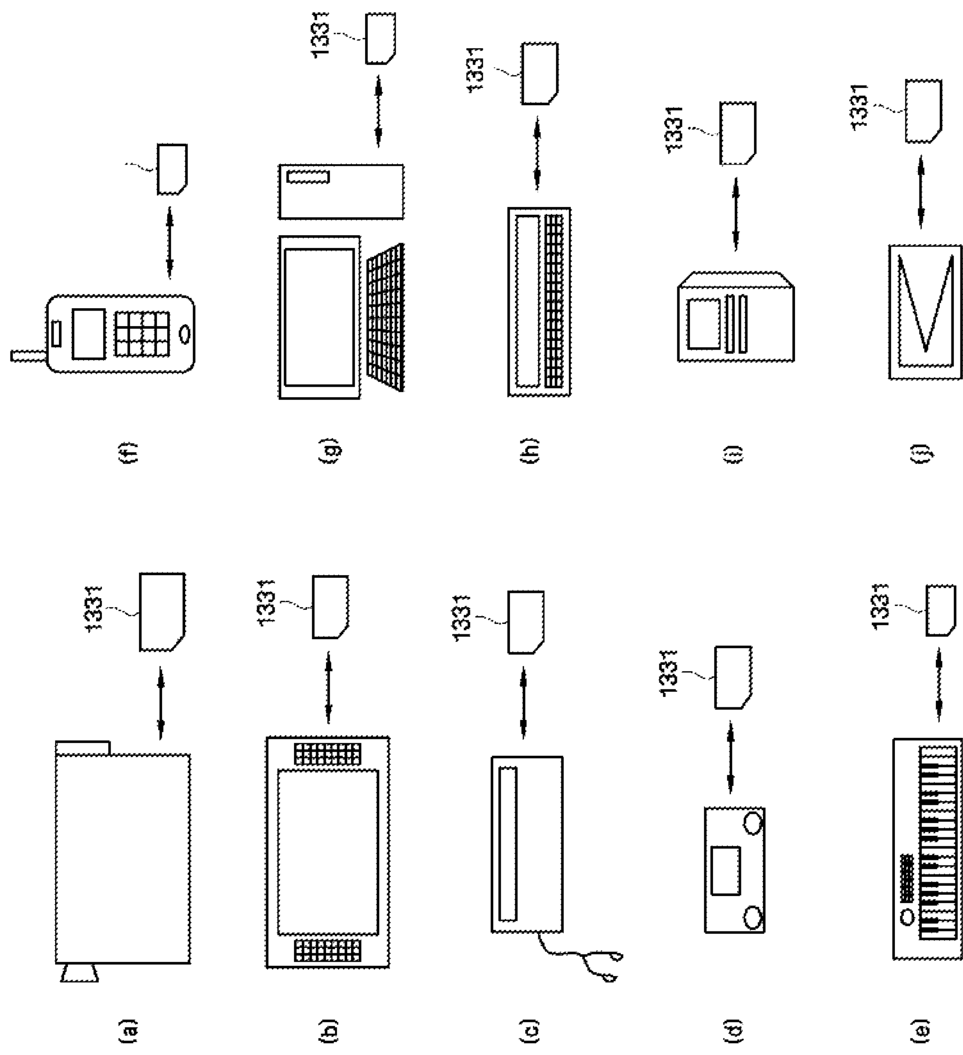

FIG. 15 is a diagram illustrating various systems that use the memory card of FIG. 13.

Referring to FIG. 15, a memory card 1331 may be used in (a) a video camera, (b) a television, (c) an audio device, (d) a game device, (e) an electronic music device, (f) a mobile phone, (g) a computer, (h) a personal digital assistant (PDA), (i) a voice recorder, and (j) a personal computer (PC) card.

Figure 16:
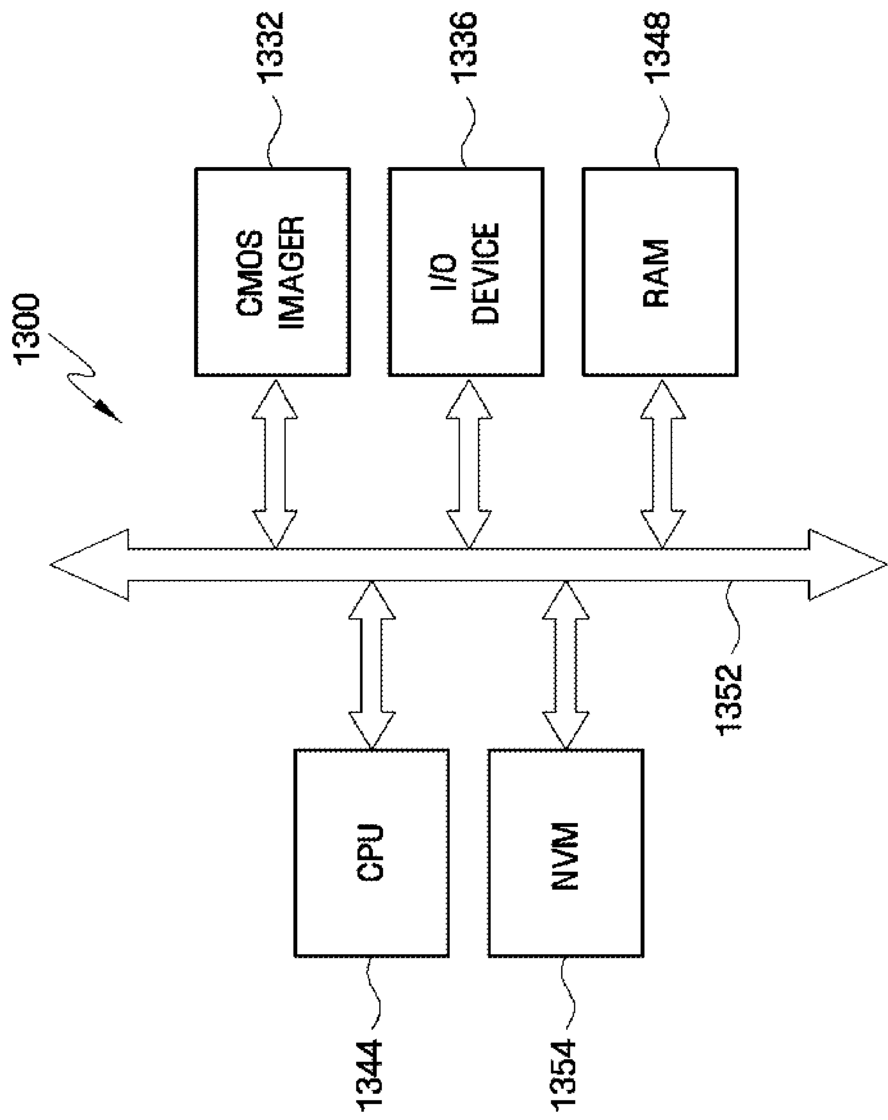

FIG. 16 is a diagram illustrating an image sensor system 1300 that uses variable resistance memory devices according to embodiments of the present inventive concepts.

Referring to FIG. 16 the image sensor system 1300 may include an image sensor 1332 (e.g., a CMOS imager), an input/output (I/O) device 1336, a random access memory (RAM) 1348, a central processing unit (CPU) 1344, and a non volatile variable resistance memory device 1354 according to embodiments of the present inventive concepts. These components, i.e., the image sensor 1332, the I/O device 1336, the RAM 1348, the CPU 1344, and the variable resistance memory device 1354 communicate with each other using a bus 1152. The image sensor 1332 may include a photo sensing element such as a photogate or a photodiode. Each of the above components and a processor may be implemented as a single chip or separate chips.

While the present inventive concepts has been particularly shown and described with reference to exemplary embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A circuit for generating a write signal, the circuit comprising:

a pre-emphasis signal generator that receives location information of a to-be-programmed memory cell and generates a pre-emphasis signal depending on the location information of the to-be-programmed memory cell; and a write driver that generates a program signal corresponding to data to be programmed in the to-be-programmed memory cell, generates a write signal by combining the program signal with the pre-emphasis signal supplied from the pre-emphasis signal generator, and outputs the write signal to the to-be-programmed memory cell;

wherein the pre-emphasis signal generator comprises a signal magnitude reducing unit that reduces a magnitude of the program signal when the program signal is combined with the pre-emphasis signal.

2. The circuit of claim 1, wherein the pre-emphasis signal generator increases a magnitude of the pre-emphasis signal with an increase in distance between the to-be-programmed memory cell and the write driver.

3. The circuit of claim 1, wherein the pre-emphasis signal generator increases a pulse-width of the pre-emphasis signal with an increase in distance between the to-be-programmed memory cell and the write driver.

4. The circuit of claim 1, wherein the pre-emphasis signal generator comprises:

a signal width adjusting unit that adjusts a pulse width of the pre-emphasis signal according to the time in which a control signal is applied; and a signal magnitude adjusting unit that adjusts a magnitude of the pre-emphasis signal according to the magnitude of a bias signal.

5. The circuit of claim 4, wherein the write driver comprises a feedback amplifier that generates the write signal.

6. The circuit of claim 1, wherein the pre-emphasis signal generator generates a multi-bit digital control signal according to the location information of the to-be-programmed memory cell, and adjusts a magnitude of the pre-emphasis signal according to the generated digital control signal.

7. The circuit of claim 6, wherein the pre-emphasis signal generator adjusts the magnitude of the pre-emphasis signal in accordance with a linear decoding scheme.

8. The circuit of claim 6, wherein the pre-emphasis signal generator adjusts the magnitude of the pre-emphasis signal in accordance with a binary decoding scheme.

9. The circuit of claim 6, wherein the pre-emphasis signal generator comprises a plurality of pre-emphasis signal magnitude adjusting transistors having respectively different channel widths.

10. The circuit of claim 1, wherein the signal magnitude reducing unit comprises a ground transistor that is responsive to a negative control signal to divert at least some of the program signal to a ground terminal.

11. The circuit of claim 1, wherein a first portion of the write signal has a larger magnitude than the program signal, and a second portion of the write signal has a smaller magnitude than the program signal.

12. The circuit of claim 1, wherein the program signal, the pre-emphasis signal and the write signal are respective current signals.

13. A variable resistance memory device comprising:

a memory cell array including a plurality of variable resistance memory cells;

an address decoder that receives address information and outputs location information of a to-be-programmed memory cell among the plurality of variable resistance memory cells;

a pre-emphasis signal generator that receives the location information of the to-be-programmed memory cell from the address decoder and generates a pre-emphasis signal depending on the location information of the to-be-programmed memory cell; and a write driver that generates a program signal corresponding to data to be programmed in the to-be-programmed memory cell, generates a write signal by combining the program signal with the pre-emphasis signal supplied from the pre-emphasis signal generator, and outputs the write signal to the to-be-programmed memory cell;

wherein the pre-emphasis signal generator comprises a signal magnitude reducing unit that reduces a magnitude of the program signal when the program signal is combined with the pre-emphasis signal.

14. The variable resistance memory of claim 13, wherein the variable resistance memory cell includes a phase change memory cell.

15. A method of programming a memory device including a write driver operatively connected to a memory cell array, the memory cell array including a plurality of variable resistance memory cells, the method comprising:

generating a write signal in accordance with a write data to be programmed in a to-be-programmed variable resistance memory cell of the memory cell array;

generating a pre-emphasis signal in accordance with a relative location of the to-be-programmed variable resistance memory cell within the memory cell array;

combining the write signal and the pre-emphasis signal to generate a program signal;

applying the program signal to the to-be-programmed variable resistance memory cell; and combining the program signal with the pre-emphasis signal in conjunction with reducing a magnitude of the program signal.

16. The method of claim 15, wherein the pre-emphasis signal is generated such that a magnitude of the program signal increases with an increase in distance between the to-be-programmed variable resistance memory cell and the write driver.

17. The method of claim 16, wherein the variable resistance memory cells are phase-change memory cells, and the program signal is one of a SET write current and a RESET write current.

18. The method of claim 16, wherein the program signal is applied to a bit line of the memory cell array.

19. The method of claim 15, further comprising decoding an address of the to-be-programmed variable resistance memory cell to determine the relative location of the to-be-programmed variable resistance memory cell within the memory cell array.

* * * * *